(12) United States Patent
Wu et al.

(10) Patent No.: US 10,164,095 B2
(45) Date of Patent: Dec. 25, 2018

(54) FINFET WITH DOPED ISOLATION INSULATING LAYER

(71) Applicant: TAIWAN SEMICONDUCTOR MANUFACTURING CO., LTD., Hsinchu (TW)

(72) Inventors: Cheng-Ta Wu, Chiayi County (TW); Ting-Chun Wang, Tainan (TW); Wei-Ming You, Taipei (TW); J. W. Wu, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 14/805,450

(22) Filed: Jul. 21, 2015

(65) Prior Publication Data
US 2017/0025535 A1   Jan. 26, 2017

(51) Int. Cl.
| H01L 29/78 | (2006.01) |
| H01L 29/417 | (2006.01) |
| H01L 29/66 | (2006.01) |
| H01L 29/06 | (2006.01) |
| H01L 21/265 | (2006.01) |
| H01L 21/324 | (2006.01) |

(52) U.S. Cl.
CPC .... *H01L 29/7843* (2013.01); *H01L 21/26506* (2013.01); *H01L 21/324* (2013.01); *H01L 29/0649* (2013.01); *H01L 29/41783* (2013.01); *H01L 29/66795* (2013.01); *H01L 29/785* (2013.01)

(58) Field of Classification Search
CPC .. H01L 29/7943; H01L 29/785–29/786; H01L 2029/7857; H01L 2029/7858; H01L 29/7846
See application file for complete search history.

(56) References Cited

U.S. PATENT DOCUMENTS

2005/0285137 A1* 12/2005 Satoh .............. H01L 21/823807
257/178
2008/0150037 A1*  6/2008 Teo ................... H01L 21/31155
257/374
(Continued)

FOREIGN PATENT DOCUMENTS

KR   10-2015-0077366 A    7/2015
TW        201351505 A    12/2013
(Continued)

OTHER PUBLICATIONS

Office Action Taiwanese Patent Application No. 104139589 dated Jan. 26, 2017.
(Continued)

*Primary Examiner* — Joshua King
(74) *Attorney, Agent, or Firm* — McDermott Will & Emery, LLP

(57) ABSTRACT

A method for manufacturing a semiconductor device is provided including forming one or more fins over a substrate and forming an isolation insulating layer over the one or more fins. A dopant is introduced into the isolation insulating layer. The isolation insulating layer containing the dopant is annealed, and a portion of the oxide layer is removed so as to expose a portion of the fins.

20 Claims, 9 Drawing Sheets

(56) References Cited

U.S. PATENT DOCUMENTS

| | | | |
|---|---|---|---|
| 2009/0072276 A1* | 3/2009 | Inaba | H01L 21/823807 257/255 |
| 2009/0273052 A1* | 11/2009 | Chuang | H01L 21/823412 257/506 |
| 2010/0323494 A1* | 12/2010 | Liao | H01L 21/76237 438/423 |
| 2012/0302038 A1* | 11/2012 | Zheng | H01L 21/823878 438/433 |
| 2013/0092984 A1* | 4/2013 | Liu | H01L 29/66795 257/288 |
| 2013/0234280 A1* | 9/2013 | Kumar | H01L 27/10847 257/506 |
| 2013/0260532 A1* | 10/2013 | Yin | H01L 21/76237 438/430 |
| 2013/0330906 A1 | 12/2013 | Yu et al. | |
| 2014/0183641 A1 | 7/2014 | Fan et al. | |
| 2014/0239404 A1 | 8/2014 | Huang et al. | |
| 2015/0061077 A1 | 3/2015 | Cheng et al. | |
| 2015/0118823 A1* | 4/2015 | Nier | H01L 29/7847 438/433 |
| 2015/0187634 A1 | 7/2015 | Chiang et al. | |

FOREIGN PATENT DOCUMENTS

| | | |
|---|---|---|
| TW | 201428975 A | 7/2014 |
| TW | 201434155 A | 9/2014 |
| TW | 201517177 A | 5/2015 |

OTHER PUBLICATIONS

Notification of Reasons for Refusal Korean Patent Application No. 10-2015-0164233 dated May 15, 2017 with English translation.

\* cited by examiner

FINFET WITH DOPED ISOLATION INSULATING LAYER

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). FinFET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in source/drain (S/D) portions of the FinFET utilizing, for example, silicon germanium (SiGe), silicon phosphide (SiP) or silicon carbide (SiC), may be used to enhance carrier mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
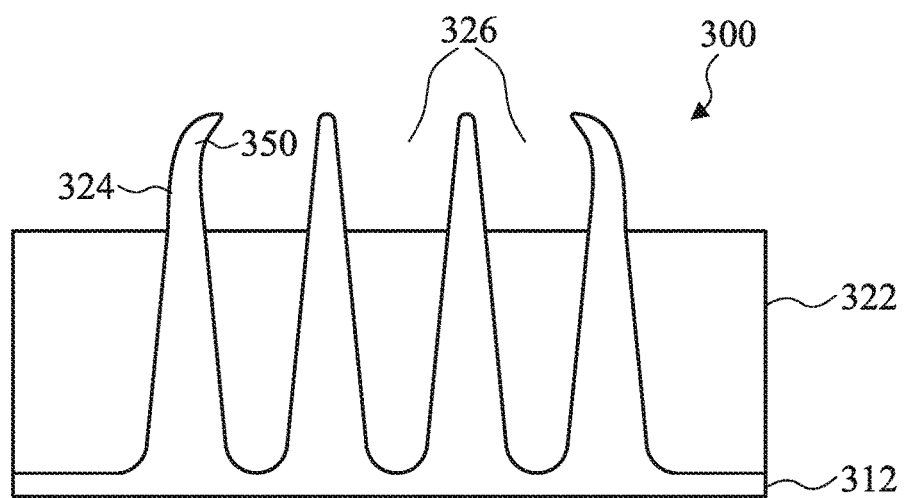
FIG. 1 illustrates an example of fin bending in a semiconductor device.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Examples of devices that can benefit from one or more embodiments of the present disclosure are semiconductor devices. Such a device, for example, is a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will include a FinFET example to illustrate various embodiments of the present application. It is understood, however, that the application should not be limited to a particular type of device, except as specifically claimed.

Fin bending and crystal dislocation is major yield killer in the manufacture of FinFET semiconductor devices. Fin bending and crystal dislocation, such as silicon crystal dislocation, may be caused by shallow trench isolation (STI) oxide shrinkage during high temperature anneal. In addition, fin bending/crystal dislocation may be worsened by thinning of the fins caused by oxidation of the fins during high temperature annealing operations. Oxygen in the shallow trench isolation region may react with silicon on the fin surface to form silicon oxide during high temperature annealing. The combination of tensile stress due to STI oxide shrinkage and fin oxidation can lead to unacceptable device yield.

An example of fin bending in a semiconductor device 300 is shown in FIG. 1. Upper portions 350 of the fins 324 on a semiconductor substrate 312 may be bent due to shallow trench isolation 322 oxide shrinkage during high temperature anneal. Fin bending may be worse in the fins 324 at the end of a fin array than in fins 324 that are separated from adjacent fins by a trench 326 on both sides of the fin 324. Fins may be stabilized by adjacent fins so that fin bending is not as severe as severe for internal fins as fins at the end of a fin array.

Doping the STI region with a large atom species, such as one or more selected from the group consisting of antimony, arsenic, germanium, indium, and silicon prior to high temperature annealing reduces fin bending and crystal dislocation. The implanted large atom species can reduce the tensile stress in the STI region and/or generate a compressive stress in the STI region, rather than a tensile stress. In addition, the implanted dopant may react with oxygen in the STI region during high temperature annealing, thereby preventing the oxygen from oxidizing the fin surface and deteriorating the fin.

Figure 2:
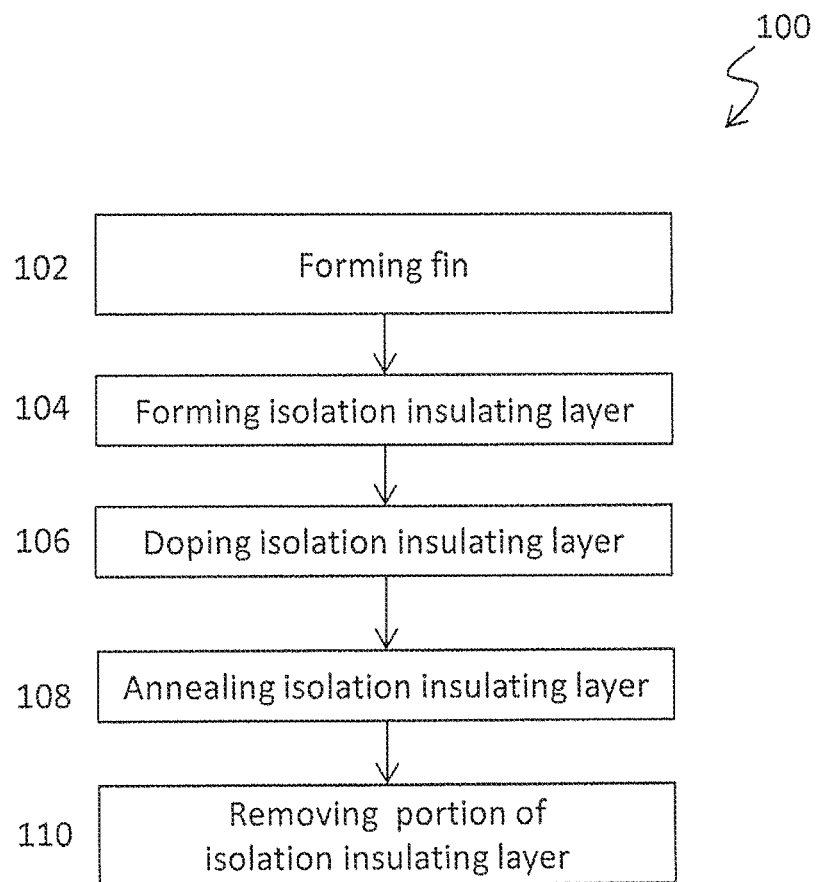
FIG. 2 is an exemplary process flow chart for manufacturing a semiconductor FET device having a fin structure (FinFET) according to an embodiment of the present disclosure.

An exemplary method for manufacturing a semiconductor FET device having a fin structure (FinFET) according to an embodiment of the present disclosure is illustrated in FIG. 2. An exemplary method 100 includes an operation 102 of forming a one or more fins over a substrate and an operation 104 of forming an isolation insulating layer over the one or more fins. An operation 106 of introducing a dopant into the isolation insulating layer is performed followed by an operation 108 of annealing the isolation insulating layer containing the dopant. A portion of the fins is exposed in an operation 110 of removing a portion of the isolation insulating layer.

Figure 3:
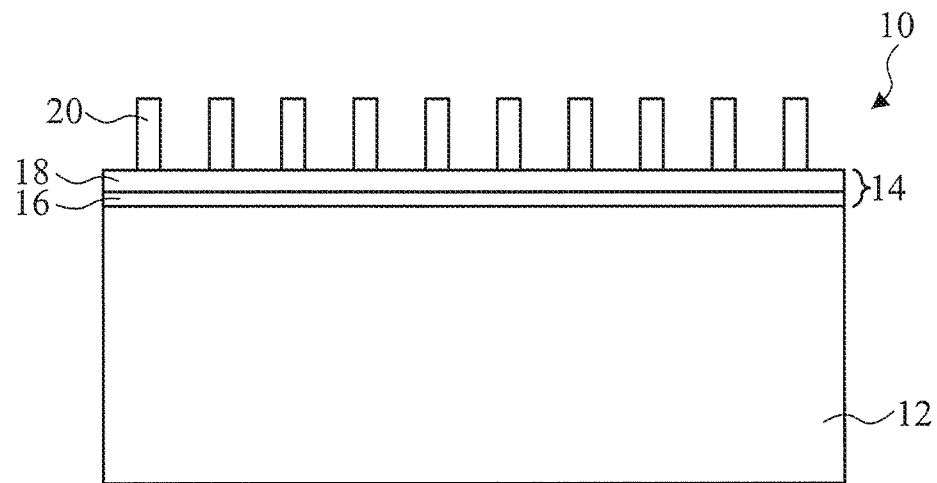
FIGS. 3-13 show intermediate stages of an exemplary sequential method for manufacturing a semiconductor device and a semiconductor device in accordance with an embodiment of the disclosure.

To fabricate one or more fins according to one embodiment, mask layer 14 is formed over a substrate 12, as illustrated in FIG. 3. The mask layer 14 is formed by, for example, one or more of a thermal oxidation process and/or a chemical vapor deposition (CVD) process. The substrate 12 is, for example, a p-type silicon substrate with an impurity concentration in a range of about $1\times10^{15}$ cm$^{-3}$ to about $2\times10^{15}$ cm$^{-3}$. In other embodiments, the substrate 12 is an n-type silicon substrate with an impurity concentration in a range of about $1\times10^{15}$ cm$^{-3}$ to about $2\times10^{15}$ cm$^{-3}$. The mask layer 14 includes, for example, a pad oxide (e.g., silicon oxide) layer 16 and a silicon nitride mask layer 18 in some embodiments.

Alternatively, the substrate 12 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 12 is a silicon layer of an SOI (silicon-on insulator) substrate. When an SOI substrate is used, the fins may protrude from the silicon layer of the SOI substrate or may protrude from the insulator layer of the SOI substrate. In the latter case, the silicon layer of the SOI substrate is used to form the fins. Amorphous substrates, such as amorphous Si or amorphous SiC, or insulating material, such as silicon oxide may also be used as the substrate 12. The substrate 12 may include various regions that have been suitably doped with impurities (e.g., p-type or n-type conductivity).

The pad oxide layer 16 may be formed by using thermal oxidation or a CVD process. The silicon nitride mask layer 18 may be formed by CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), or a physical vapor deposition (PVD), such as a sputtering method, and/or other processes.

The thickness of the pad oxide layer 16 is in a range of about 2 nm to about 15 nm and the thickness of the silicon nitride mask layer 18 is in a range of about 2 nm to about 50 nm in some embodiments. A mask pattern 20 is further formed over the mask layer 14. The mask pattern 20 is, for example, a resist pattern formed by lithography operations.

By using the mask pattern 20 as an etching mask, a hard mask pattern of the pad oxide layer 16 and the silicon nitride mask layer 18 is formed. The width of the hard mask pattern is in a range of about 5 nm to about 40 nm in some embodiments. In certain embodiments, the width of the hard mask patterns is in a range of about 7 nm to about 12 nm.

Figure 4:
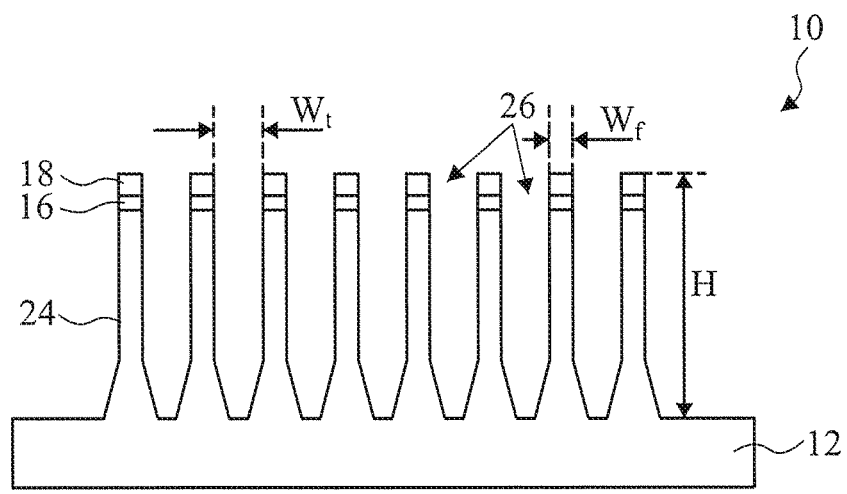

By using the hard mask pattern as an etching mask, the substrate 12 is patterned into a plurality of fins 24, as shown in FIG. 4, by trench etching using a dry etching method and/or a wet etching method to form trenches 26. A height H of the fins 24 is in a range of about 20 nm to about 300 nm. In certain embodiments, the height is in a range of about 30 nm to about 60 nm. When the heights of the fins 24 are not uniform, the height from the substrate may be measured from the plane that corresponds to the average heights of the fins 24. The width $W_f$ of each of the fins 24 is in a range of about 7 nm to about 15 nm in some embodiments.

As shown in FIG. 4, eight fins 24 are disposed over the substrate 12. However, the number of fins is not limited to eight. There may be as few as one fin and more than eight fins. In addition, one or more dummy fins may be disposed adjacent to the sides of the fins to improve pattern fidelity in the patterning processes. The width of each fin 24 is in a range of about 5 nm to about 40 nm in some embodiments, and may be in a range of about 7 nm to about 15 nm in certain embodiments. The width $W_t$ of trenches 26 between adjacent fins is in a range of about 5 nm to about 80 nm in some embodiments, and may be in a range of about 7 nm to about 15 nm in other embodiments. One skilled in the art will realize, however, that the dimensions and values recited throughout the descriptions are merely exemplary, and may be changed to suit different scales of integrated circuits.

In this embodiment, the FinFET device is a p-type FinFET. However, the technologies disclosed herein are also applicable to an n-type FinFET.

Figure 5:
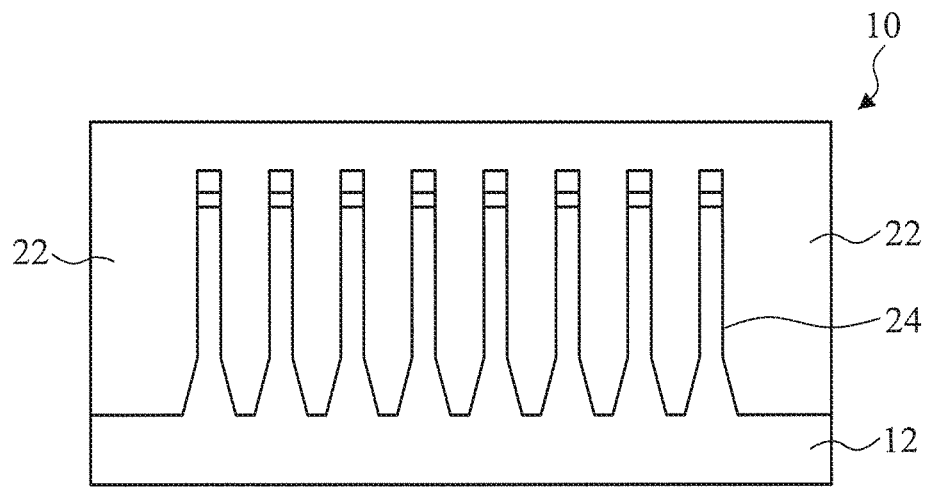

After forming the fins 24, an isolation insulating layer 22 is formed in trenches 26 between the fins 24 and overlying the fins 24, so that the fins 24 are buried in isolation insulating layer 22, as illustrated in FIG. 5. The isolation insulating layer 22 is also referred to as a shallow trench insulation (STI). The STI includes one or more layers, in certain embodiments.

The isolation insulating layer 22 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 22 may be formed by one or more layers of SOG, SiO, SiON, SiOCN and/or fluoride-doped silicate glass (FSG) in some embodiments.

Figure 6:
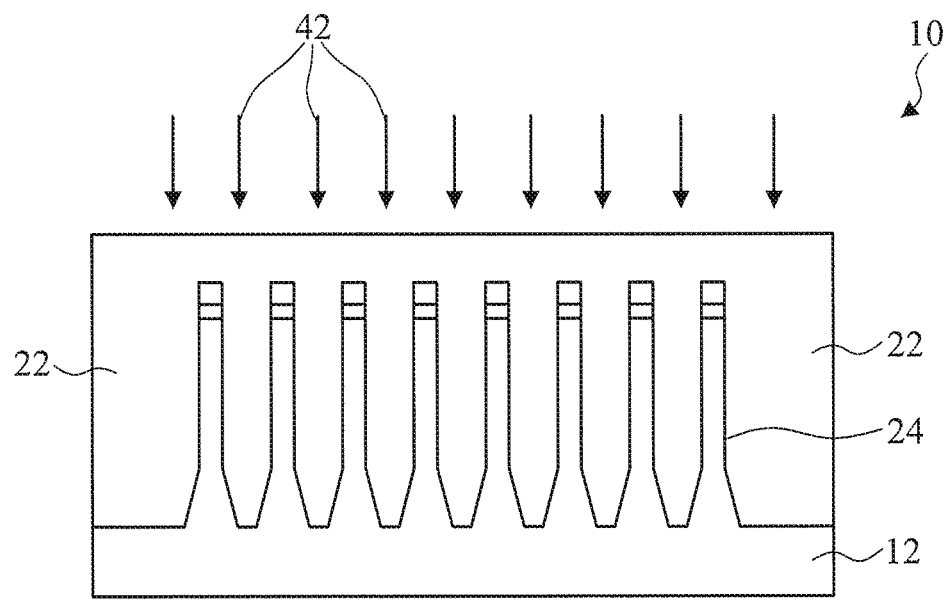

After forming the isolation insulating layer 22 over the fins 24, an oxygen reactive large atom species dopant 42, such as antimony, arsenic, germanium, indium, or silicon, is implanted in the isolation insulating layer 22, as shown in FIG. 6. Implantation of the oxygen reactive large atom species 42 may reduce the tensile stress in the isolation insulating layer, or even change the stress in the isolation insulating layer from tensile stress to compressive stress. Furthermore, implanting a dopant species such as antimony, arsenic, germanium, indium, or silicon can provide the seed necessary to react free oxygen in the isolation insulating layer with the implanted species. In certain embodiments, the dopant is introduced into the isolation insulating layer by ion implantation.

The dopant may be implanted at an energy of about 1 KeV to 80 KeV and a dose of about $1\times10^{13}$ to $1\times10^{17}$ atoms/cm$^2$. In certain embodiments, the device 10 is subsequently annealed at about 200 to 650° C. for about 20 to 60 minutes followed by heating at about 1000 to 1100° C. for about 0.5 to 2 hours. In certain embodiments, the dopant is Ge and it is implanted at an energy of about 10 KeV to 35 KeV and a dose of about $1\times10^{15}$ to $1\times10^{16}$ atoms/cm$^2$. In certain embodiments, the dopant is Ge, the energy is about 30 KeV to 35 KeV, and the dose is about $2\times10^{15}$ to $5\times10^{15}$ atoms/cm$^2$. In another embodiment, the dopant is Si, the energy is about 20 KeV to 30 KeV, and the dose is about $1\times10^{15}$ to $5\times10^{15}$ atoms/cm$^2$.

Figure 7:
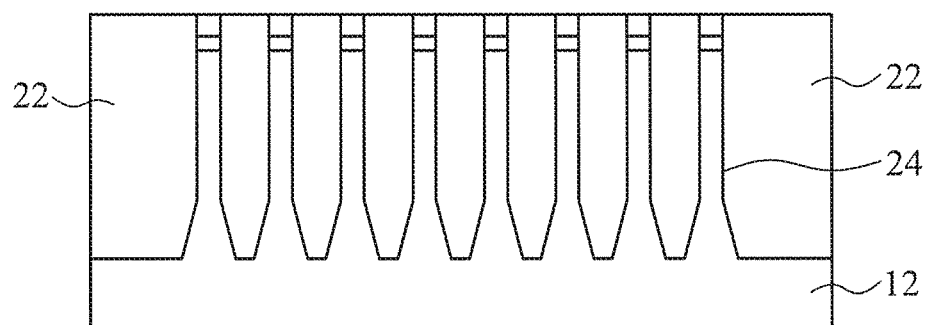

A planarization operation is performed so as to remove part of the isolation insulating layer 22. The planarization operation may include a chemical mechanical polishing (CMP) and/or an etch-back process, as illustrated in FIG. 7. After the planarization operation, the device 10 may undergo a second anneal at about 200 to 650° C. for about 20 to 60 minutes followed by heating at about 1100 to 1100° C. for about 0.4 to 4 hours. The annealing operations may improve the quality of the isolation insulating layer 22. The annealing operations may be performed in an inert gas ambient, such as an N$_2$, Ar, or He ambient.

As a result of implanting the large atom species, the STI region may have either a reduced tensile stress in the STI region and/or a compressive stress in the STI region, rather than a tensile stress after the annealing operations.

Figure 8:
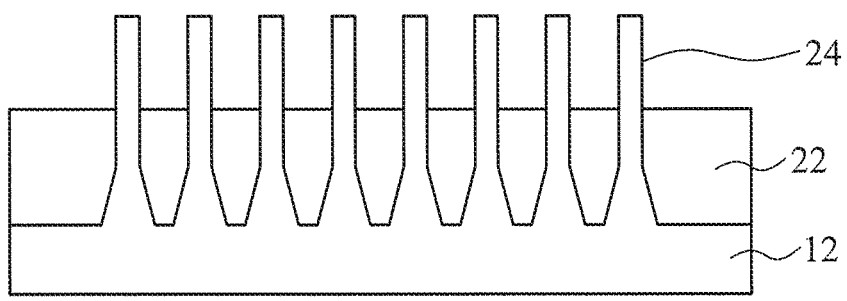

The mask layer 14 may be removed, and an upper portion of the isolation insulating layer 22 is further removed so that the channel region (upper portion) of the fins 24 is exposed, as shown in FIG. 8.

In certain embodiments, removal of the mask layer 14 and partially removing the isolation insulating layer 22 may be performed using a suitable etching process. For example, the insulating layer 22 may be removed by a wet etching process, such as, by dipping the substrate in hydrofluoric acid (HF). On the other hand, the partially removing the isolation insulating layer 22 may be performed using a dry etching process. For example, a dry etching process using CHF$_3$ or BF$_3$ as etching gases may be used. In certain embodiments, a combination of wet and dry etching operations are used.

Figure 9:
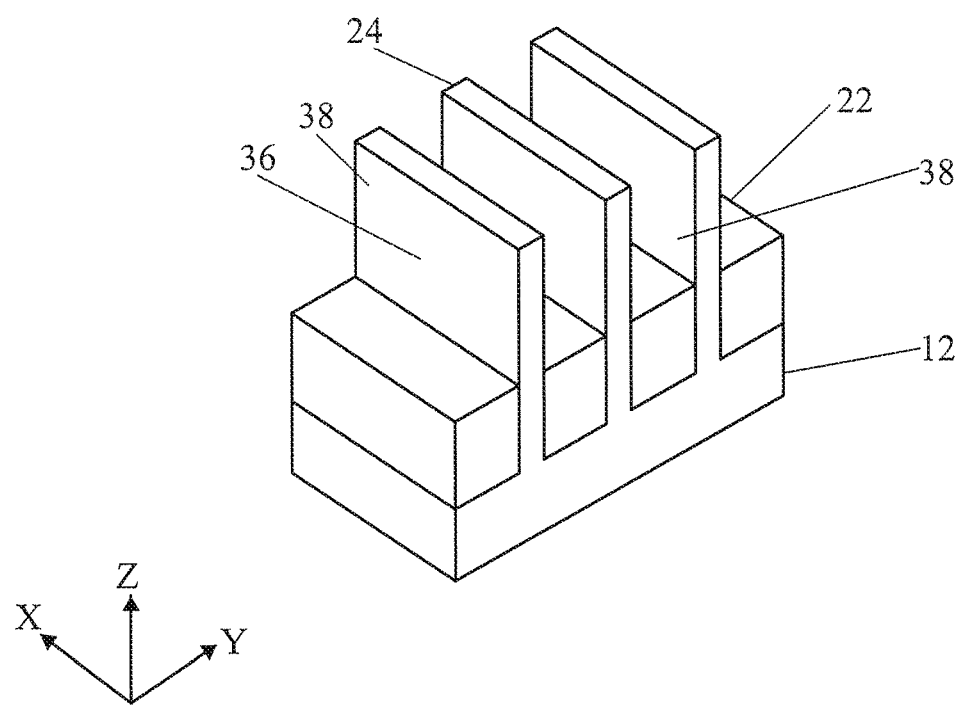

An isometric view of the device 10 showing the fins 24 exposed from the isolation insulating layer 22 is depicted in FIG. 9. To simplify the disclosure, only three fins are shown in FIG. 9. The exposed portions of the fins 24 comprise two regions. A first region 36 in a central portion of the fin 24 is where a gate structure will be formed, and a second region 38 at the peripheral portions of the fin 24 is where source/drain regions will be formed.

Figure 10:
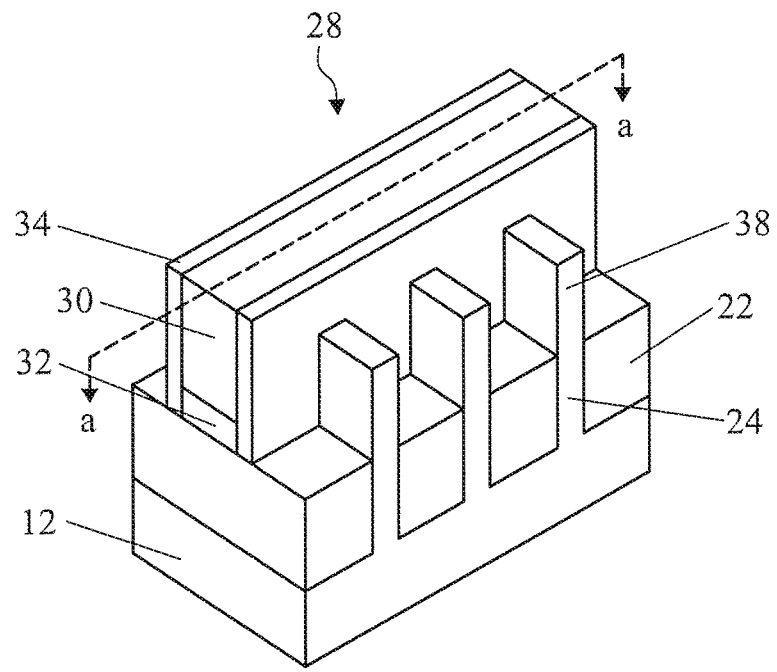
Figure 11:
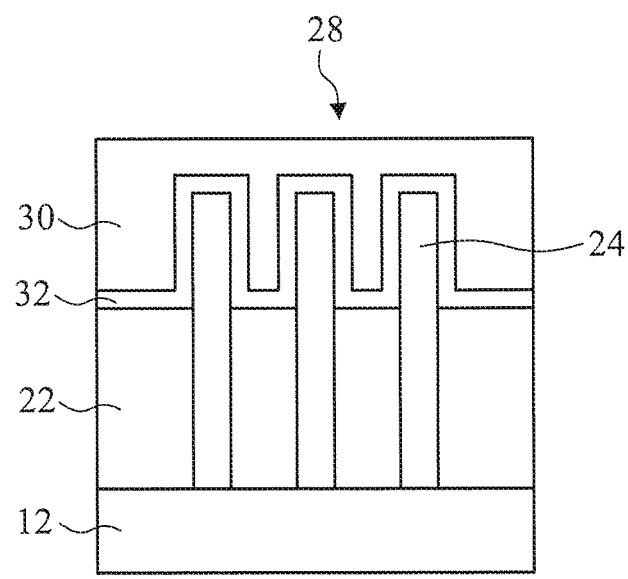

In certain embodiments, a gate structure 28 is formed over the first region 36 of the fins, as shown in FIG. 10. The gate structure formation process may include the operations of depositing a gate dielectric 32, depositing a gate electrode 30, patterning the gate, lightly doped drain (LDD) implantation, and annealing. Sidewall spacers 34 are subsequently formed on the gate structure 28, and source/drain implantation and annealing is performed. FIG. 11 is a cross section taken along line a-a of FIG. 10, showing the arrangement of the fins 24 and the gate structure 28.

In certain embodiments, the gate dielectric 32 includes one or more layers of dielectric materials, such as silicon oxide, silicon nitride, silicon oxynitride, high-k dielectric material, other suitable dielectric material, and/or combinations thereof. Examples of high-k dielectric material include HfO$_2$, HfSiO, HfSiON, HfTaO, HfSiO, HfZrO, zirconium oxide, aluminum oxide, titanium oxide, and hafnium dioxide-alumina (HfO$_2$—Al$_2$O$_3$) alloy. In some embodiments, the gate dielectric 32 may include an interfacial layer made of silicon dioxide.

The gate electrode 30 in certain embodiments includes one or more layers of any suitable material, including polysilicon and may include a hard mask formed over the gate electrode. The hard mask may be made a suitable hard mask material, including SiO$_2$, SiN, or SiCN. In some embodiments, a thickness of the gate dielectric layer is in a range of about 5 nm to about 20 nm, and in a range of about 5 nm to about 10 nm in other embodiments. The gate structure may comprise additional layers such as interfacial layers, capping layers, diffusion/barrier layers, dielectric layers, conductive layers, and other suitable layers, and combinations thereof. In addition to polysilicon, the gate electrode 30 may comprise any other suitable material, such as one or more metal layers, including aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, or combinations thereof. In some embodiments, a thickness of the gate electrode layer is in a range of about 50 nm to about 400 nm, and may be in a range of about 100 nm to 200 nm.

In certain embodiments, the FinFET can be fabricated using a gate first method or a gate last method. In embodiments using a high-k dielectric and a metal gate (HK/MG), a gate last method is employed to form the gate electrode. In the gate last method, a dummy gate is formed, the dummy gate is subsequently removed at a later operation after a high temperature annealing operation, and the high k dielectric and a metal gate (HK/MG) is formed.

In some embodiments, the sidewall spacers 34 are used to offset subsequently formed doped regions, such as source/drain regions. The sidewall spacers 34 may further be used for designing or modifying the source/drain region (junction) profile. The sidewall spacers 34 may be formed by suitable deposition and etch techniques, and may comprise silicon nitride, silicon carbide, silicon oxynitride, other suitable materials, or combinations thereof.

A blanket layer of a side-wall insulating material may be formed by CVD, PVD, ALD, or other suitable technique. Then, an anisotropic etching is performed on the side-wall insulating material to form a pair of side-wall insulating layers (spacers) 34 on two main sides of the gate structure. The thickness of the side-wall insulating layers 34 is in a range of about 5 nm to about 30 nm in some embodiments, and in a range of about 10 nm to about 20 nm in other embodiments. As shown in FIG. 10, the side wall insulating layer may not be formed over the regions of the fin that is to become the source and drain.

Figure 12:
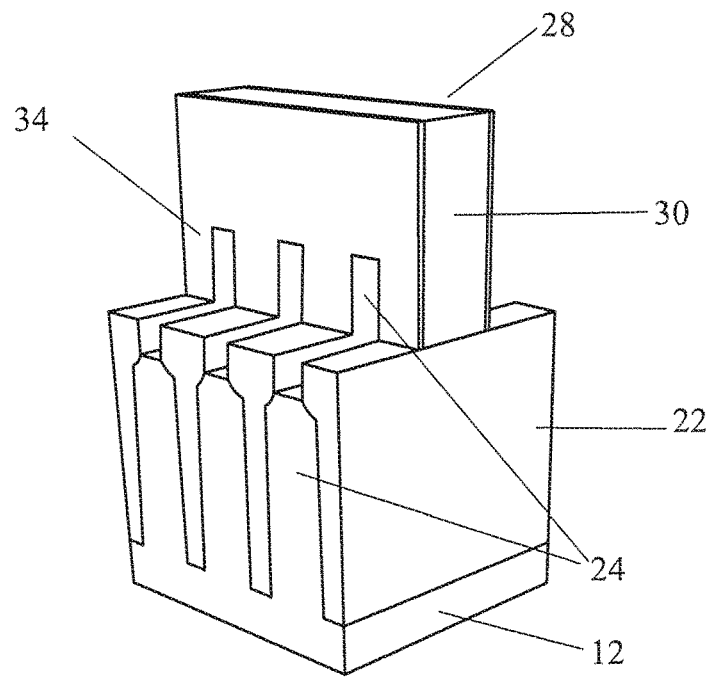

The second region 38 of the fins not covered with the gate structure 28 are subsequently etched to remove the portion of the fins above the STI region 22, as shown in FIG. 12. Suitable photolithographic and etching techniques can be used to remove the second region 38 of the fins.

Figure 13:
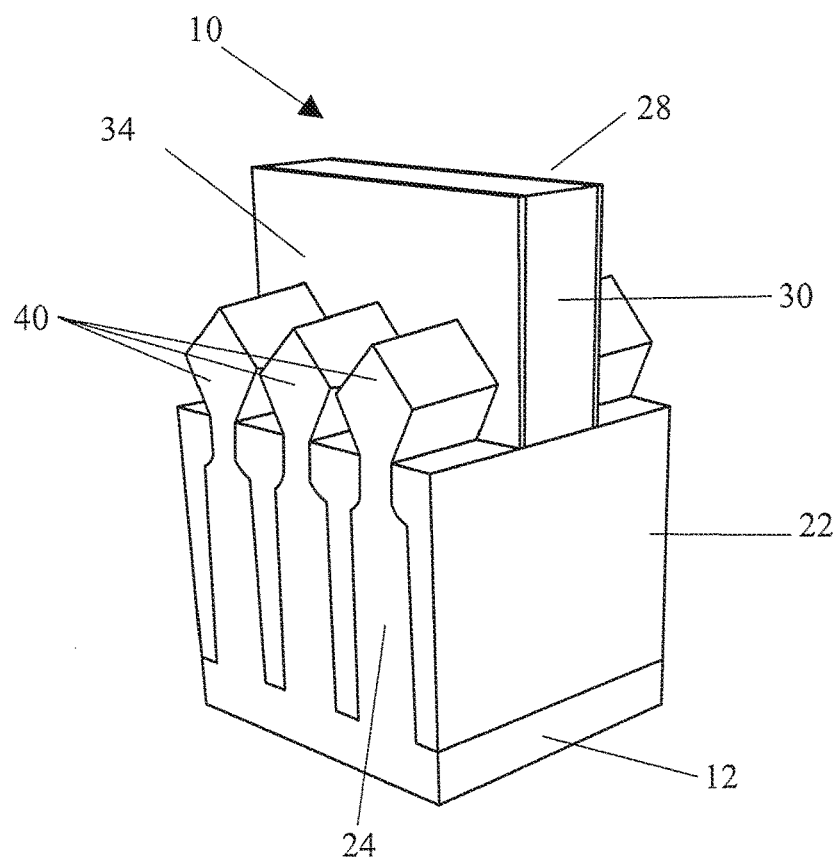

In certain embodiments, raised source/drain regions 40 are subsequently formed overlying the etched portion of the fins 24, as shown in FIG. 13, providing a FinFET semiconductor device 10. The raised source/drain regions may be formed by one or more epitaxy or epitaxial (epi) processes, such that Si features, SiC features, SiGe features, SiP features, SiCP features, or Group III-V semiconductor material on Si EPI or other suitable features are formed in a crystalline state on the fins. The epitaxy processes include CVD deposition techniques (e.g., vapor-phase epitaxy (VPE) and/or ultra-high vacuum CVD (UHV-CVD)), molecular beam epitaxy, and/or other suitable processes.

In some embodiments of the disclosure, source/drain electrodes are formed contacting the respective source/drain regions. The electrodes may be formed of a suitable conductive material, such as copper, tungsten, nickel, titanium, or the like. In some embodiments, a metal silicide is formed at the conductive material and source/drain interface to improve conductivity at the interface. In one example, a damascene and/or dual damascene process is used to form copper-based multilayer interconnection structures. In another embodiment, tungsten is used to form tungsten plugs.

Subsequent processing according to embodiments of the disclosure may also form various contacts/vias/lines and multilayer interconnects features (e.g., metal layers and interlayer dielectrics) on the semiconductor substrate, configured to connect the various features or structures of the FinFET device. For example, a multilayer interconnection includes vertical interconnects, such as conventional vias or contacts, and horizontal interconnects, such as metal lines.

In certain embodiments, the epitaxial growth of the source/drain regions is continued until the individual source/drain regions merge together to form a FinFET semiconductor device with merged source/drain regions.

Figure 14:
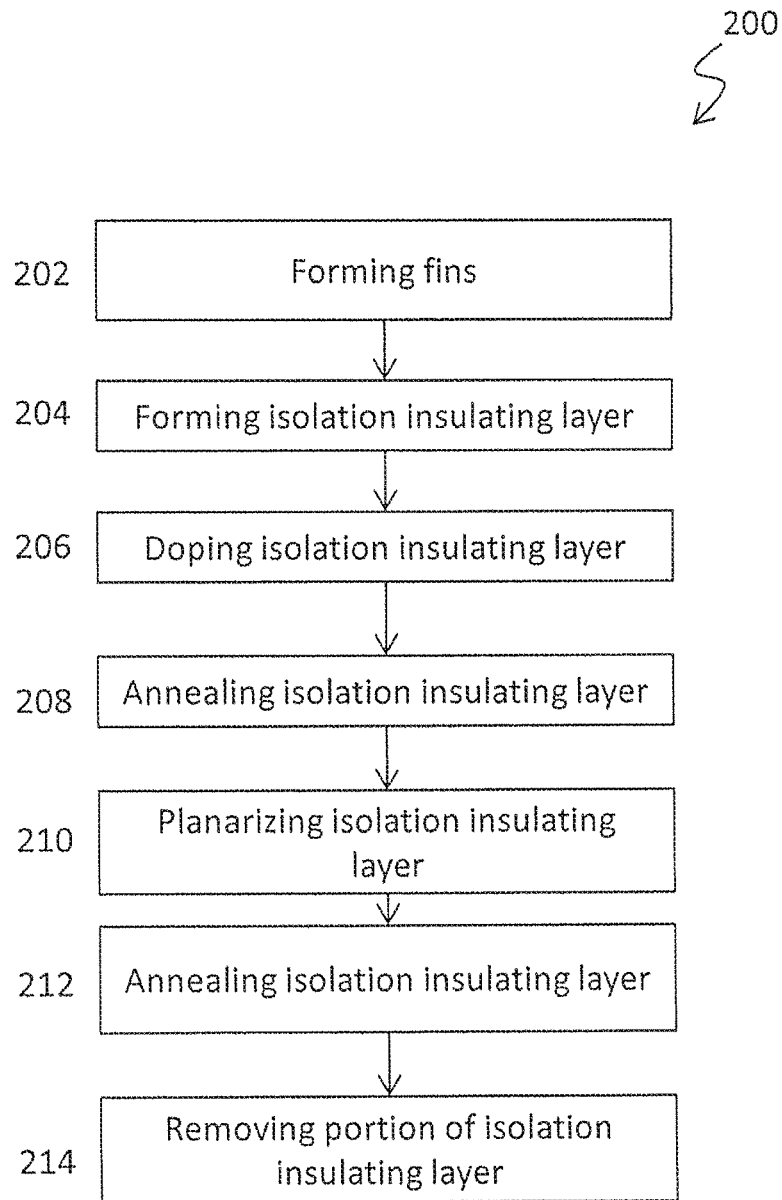
FIG. 14 is an exemplary process flow chart for manufacturing a semiconductor FET device having a FinFET according to an embodiment of the present disclosure.

Another method 200 for manufacturing a semiconductor device is illustrated in FIG. 14, and includes an operation 202 of forming a plurality of fins over a substrate. An operation 204 of forming an isolation insulating layer over the fins is performed. The isolation insulating layer fills trenches between adjacent fins and covers the fins so that the fins are buried in the isolation insulating layer. An operation 206 of doping the isolation insulating layer with a large atom species is performed, followed by a first annealing operation 208. After the first annealing, an operation 210 of planarizing the isolation insulating layer is performed, followed by a second annealing operation 212. An operation 214 of removing a portion of the isolation insulating layer is performed so as to expose a portion of the fins.

Implanting a large atom oxygen reactive material in an STI region can reduce the tensile stress in the STI region and/or generate a compressive stress in the STI region, rather than a tensile stress after high temperature annealing steps. In addition, the implanted dopant may react with oxygen in the STI region during high temperature annealing, thereby preventing the oxygen from oxidizing the fin surface and deteriorating the fin.

In one embodiment of the present disclosure, a method for manufacturing a semiconductor device includes forming one or more fins over a substrate and forming an isolation insulating layer over the one or more fins. An oxygen reactive dopant is introduced into the isolation insulating layer. The isolation insulating layer containing the dopant is annealed, and a portion of the oxide layer is removed so as to expose a portion of the fins.

In another embodiment of the disclosure, a method for manufacturing a semiconductor device includes forming a plurality of fins over a substrate. An isolation insulating layer is formed over the fins. The isolation insulating layer fills trenches between adjacent fins. An oxygen reactive dopant is introduced into the isolation insulating layer. A first annealing of the isolation insulating layer containing the dopant is performed. The isolation insulating layer is planarized. A second annealing of the isolation insulating layer is performed, and a portion of the isolation insulating layer is removed so as to expose a portion of the fins.

In another embodiment of the disclosure, a semiconductor device is provided, including one or more fins disposed on a substrate. An isolation insulating layer is disposed adjacent the one or more fins. The isolation insulating layer comprises an oxygen reactive material doped silicon oxide. A gate structure is disposed on a first region of the one or more fins and on the isolation insulating layer, and source/drain regions disposed on a second region of the one or more fins.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming one or more fins over a substrate;
   forming a mask layer over the one or more fins;
   forming an isolation insulating layer over the one or more fins so that top surfaces of the one or more fins and mask layer are buried inside the isolation insulating layer, and the isolation insulating layer contacts side surfaces of the one or more fins and mask layer;
   introducing an oxygen reactive dopant into the isolation insulating layer;
   annealing the isolation insulating layer containing the dopant and oxidizing the dopant; and
   removing a portion of the doped isolation insulating layer so as to expose a portion of the one or more fins.

2. The method for manufacturing a semiconductor device of claim 1, wherein the dopant is selected from the group consisting of antimony, arsenic, germanium, indium, silicon, and combinations thereof.

3. The method for manufacturing a semiconductor device of claim 1, wherein the dopant is introduced into the isolation insulating layer by ion implantation.

4. The method for manufacturing a semiconductor device of claim 3, wherein the dopant is implanted at an energy of about 1 KeV to 80 KeV and a dose of about $1 \times 10^{13}$ to $1 \times 10^{17}$ atoms/cm$^2$.

5. The method for manufacturing a semiconductor device of claim 1, wherein the device comprises a plurality of fins, and the isolation insulating layer is formed so that it fills trenches between adjacent fins.

6. The method for manufacturing a semiconductor device of claim 1, further comprising planarizing the isolation insulating layer after annealing the isolation insulating layer.

7. The method for manufacturing a semiconductor device of claim 6, further comprising performing a second anneal after planarizing the isolation insulating layer and before removing a portion of the isolation insulating layer.

8. The method for manufacturing a semiconductor device of claim 1, further comprising forming a gate structure on first exposed regions of the fins,
   wherein the gate structure comprises a gate dielectric layer formed on the fins and a gate electrode layer formed on the gate dielectric layer.

9. The method for manufacturing a semiconductor device of claim 8, further comprising forming source/drain regions on second regions of the fins.

10. The method for manufacturing a semiconductor device of claim 1, wherein the introducing a dopant into the isolation insulating layer imparts a compressive stress into the isolation insulating layer.

11. A method for manufacturing a semiconductor device, comprising:
   forming a plurality of fins over a substrate;

forming a mask layer over the plurality of fins;
forming an isolation insulating layer over the fins so that top surfaces of the plurality of fins and mask layer are buried inside the isolation insulating layer, and the isolation insulating layer contacts side surfaces of the one or more fins and mask layer, wherein the isolation insulating layer fills trenches between adjacent fins;
introducing an oxygen reactive dopant into the isolation insulating layer;
performing a first anneal of the isolation insulating layer containing the dopant and oxidizing the dopant;
planarizing the isolation insulating layer;
performing a second anneal of the isolation insulating layer; and
removing a portion of the doped isolation insulating layer so as to expose a portion of the fins.

12. The method for manufacturing a semiconductor device of claim 11, wherein the dopant is selected from the group consisting of antimony, arsenic, germanium, indium, silicon, and combinations thereof.

13. The method for manufacturing a semiconductor device of claim 11, wherein the isolation insulating layer comprises an oxide.

14. The method for manufacturing a semiconductor device of claim 11, wherein the introducing a dopant into the isolation insulating layer imparts a compressive stress into the isolation insulating layer.

15. The method for manufacturing a semiconductor device of claim 11, further comprising:
forming a gate structure on first exposed regions of the fins; and
forming source/drain regions on second regions of the fins.

16. A method for manufacturing a semiconductor device, comprising:
forming a mask layer and an isolation insulating layer over a plurality of fins on a semiconductor substrate so that top surfaces of the plurality of fins and mask layer are buried inside the isolation insulating layer, and the isolation insulating layer contacts side surfaces of the plurality of fins and mask layer;
introducing an oxygen reactive dopant into the isolation insulating layer;
oxidizing the oxygen reactive dopant in the isolation insulating layer,
wherein the dopant is introduced into the isolation insulating layer by ion implantation at an energy of about 1 KeV to 80 KeV and a dose of about $1\times10^{13}$ to $1\times10^{17}$ atoms/cm$^2$; and
removing a portion of the doped isolation insulating layer so as to expose a portion of the plurality of fins.

17. The method for manufacturing a semiconductor device of claim 16, wherein the oxygen reactive dopant is selected from the group consisting of antimony, arsenic, germanium, indium, silicon, and combinations thereof.

18. The method for manufacturing a semiconductor device of claim 16, further comprising:
forming a gate structure on first exposed regions of the fins; and
forming source/drain regions on second regions of the fins.

19. The method for manufacturing a semiconductor device of claim 16, further comprising:
performing a first anneal of the isolation insulating layer containing the dopant; and
planarizing the isolation insulating layer after the first anneal.

20. The method for manufacturing a semiconductor device of claim 19, further comprising performing a second anneal of the isolation insulating layer after planarizing the isolation insulating layer.

* * * * *